US 10,519,548 B2

(12) United States Patent
Noro

(10) Patent No.: US 10,519,548 B2
(45) Date of Patent: Dec. 31, 2019

(54) FILM FORMING APPARATUS

(71) Applicant: TOKYO ELECTRON LIMITED, Tokyo (JP)

(72) Inventor: Naotaka Noro, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 209 days.

(21) Appl. No.: 15/272,503

(22) Filed: Sep. 22, 2016

(65) Prior Publication Data
US 2017/0088950 A1 Mar. 30, 2017

(30) Foreign Application Priority Data

Sep. 28, 2015 (JP) .................... 2015-190007

(51) Int. Cl.
C23C 16/458 (2006.01)
C23C 16/44 (2006.01)
C23C 16/455 (2006.01)
C23C 16/46 (2006.01)
C23C 16/52 (2006.01)
H01L 21/02 (2006.01)

(52) U.S. Cl.
CPC ...... *C23C 16/4584* (2013.01); *C23C 16/4412* (2013.01); *C23C 16/455* (2013.01); *C23C 16/45534* (2013.01); *C23C 16/45544* (2013.01); *C23C 16/46* (2013.01); *C23C 16/52* (2013.01); *H01L 21/0228* (2013.01); *H01L 21/02186* (2013.01); *H01L 21/02205* (2013.01)

(58) Field of Classification Search
CPC .................................................. C23C 16/4584
See application file for complete search history.

(56) References Cited

U.S. PATENT DOCUMENTS

2003/0124820 A1* 7/2003 Johnsgard ............ C23C 16/455
438/482

FOREIGN PATENT DOCUMENTS

| JP | S61130486 A | 6/1986 |
|---|---|---|
| JP | 2006-173482 A | 6/2006 |
| JP | 2006245318 A | 9/2006 |
| JP | 2007-324286 A | 12/2007 |
| JP | 2007335800 A | 12/2007 |
| JP | 2008-235438 A | 10/2008 |
| JP | 2011171325 A | 9/2011 |
| JP | 2012059784 A | 3/2012 |

(Continued)

*Primary Examiner* — Joseph A Miller, Jr.
(74) *Attorney, Agent, or Firm* — Nath, Goldberg & Meyer; Jerald L. Meyer

(57) ABSTRACT

A film forming apparatus includes: process container to generate vacuum atmosphere; mounting part to mount substrate; heating part to heat the substrate mounted on the mounting part; gas supply part installed at rear side of the substrate mounted on the mounting part and configured to supply film forming gas toward front side of the substrate along surface of the substrate and flow rate of the film forming gas becomes uniform in width direction of flow of the film forming gas; rotation mechanism to rotate the mounting part about axis orthogonal to the substrate when the film forming gas is supplied to the substrate; film thickness adjustment part to adjust film thickness distribution of film on the substrate in flow direction of the film forming gas when viewed in state where the mounting part is stopped; and exhaust port provided at the front side of the substrate.

1 Claim, 12 Drawing Sheets

(56) References Cited

FOREIGN PATENT DOCUMENTS

| KR | 20030010601 A | 2/2003 |
|---|---|---|
| KR | 10-2014-0005818 A | 1/2014 |

\* cited by examiner

FILM FORMING APPARATUS

CROSS-REFERENCE TO RELATED APPLICATION

This application claims the benefit of Japanese Patent Application No. 2015-190007, filed on Sep. 28, 2015, in the Japan Patent Office, the disclosure of which is incorporated herein in its entirety by reference.

TECHNICAL FIELD

The present disclosure relates to a technique of forming a film by supplying a film forming gas to a surface of a substrate.

BACKGROUND

Along with the demand for pattern miniaturization of a semiconductor device, there is a variety of stringent requirements with respect to a process such as a film forming process, an etching process or the like. A double patterning process known as one of pattern miniaturization processes is taken as an example. In this process, a thin film is first formed on a pattern of a silicon oxide film. Films called sidewalls are formed by etching on both sidewalls of a concave portion that constitutes the pattern of the silicon oxide film. Subsequently, a hard mask is formed by etching a base film using the sidewalls remaining after removing a resist as a mask pattern.

In order to improve the quality of a pattern generated by sidewalls, it is necessary to match the in-plane uniformity of a thickness of a thin film and the etching characteristic of an etching apparatus. The distribution of an etching rate, which is the etching characteristic, is formed in a concentric shape so that, for example, the etching rate is high in a central portion of a substrate and low in a peripheral edge portion thereof. Thus, a concentric film thickness distribution is required even in a film forming process.

There is well-known a method in which a film forming gas is supplied from above a substrate using a shower head of a film forming apparatus. In this method, there may be a case where a singular point, at which coverage or a film quality is different, appears just below the holes of the shower head. For example, when a concentric thin film is formed by rotating a semiconductor wafer (hereinafter referred to as a "wafer") which is a substrate to be processed, there is a problem in that a circular defective portion is formed in the wafer due to the singular point.

Furthermore, in the related art, a change in an apparatus configuration such as a change in a process container structure of a film forming apparatus or the like has been performed in order to obtain a concentric film thickness distribution. However, the proper concentric film thickness distribution available after a film formation varies depending on the film quality or process of substrate processing. For that reason, in the case where the concentric film thickness distribution is adjusted by changing the apparatus configuration, it is necessary to optimize hardware for every film quality or process. This leads to an increase in the time or cost required in optimizing the hardware.

In the related art, there is known a technique in which the thickness of a film formed on a wafer is made uniform by disposing a plurality of gas injection parts in a width direction with respect to a film forming gas supply direction, changing a velocity of a gas flow in the width direction with respect to the film forming gas supply direction and rotating the wafer. However, if a film is formed by supplying a film forming gas from a lateral side, there is a problem in that a gas flow is not stabilized at a downstream side and a film thickness is not uniform.

Furthermore, in the related art, there is known a technique in which a concentric film thickness distribution is obtained by adjusting a gradient of a film thickness distribution in a radial direction when a wafer is not rotated, and rotating the wafer. However, this technique cannot solve the problems addressed in the present disclosure.

SUMMARY

Some embodiments of the present disclosure provide a technique capable of adjusting a concentric film thickness distribution of a thin film formed on a substrate.

According to one embodiment of the present disclosure, there is provided a film forming apparatus, including: a process container configured to generate a vacuum atmosphere; a mounting part provided within the process container and configured to mount a substrate thereon; a heating part configured to heat an opposite side from a mounting surface of the mounting part to heat the substrate mounted on the mounting part; a gas supply part installed at a rear side of the substrate mounted on the mounting part and configured to supply a film forming gas so that the film forming gas flows toward a front side of the substrate along a surface of the substrate over the entire surface of the substrate and so that a flow rate of the film forming gas becomes uniform in a width direction of a flow of the film forming gas; a rotation mechanism configured to rotate the mounting part about an axis orthogonal to the substrate when the film forming gas is supplied to the substrate; a film thickness adjustment part configured to adjust a film thickness distribution of a film on the substrate in a flow direction of the film forming gas when viewed in a state in which the mounting part is stopped; and an exhaust port provided at the front side of the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[First Embodiment]

Figure 1:
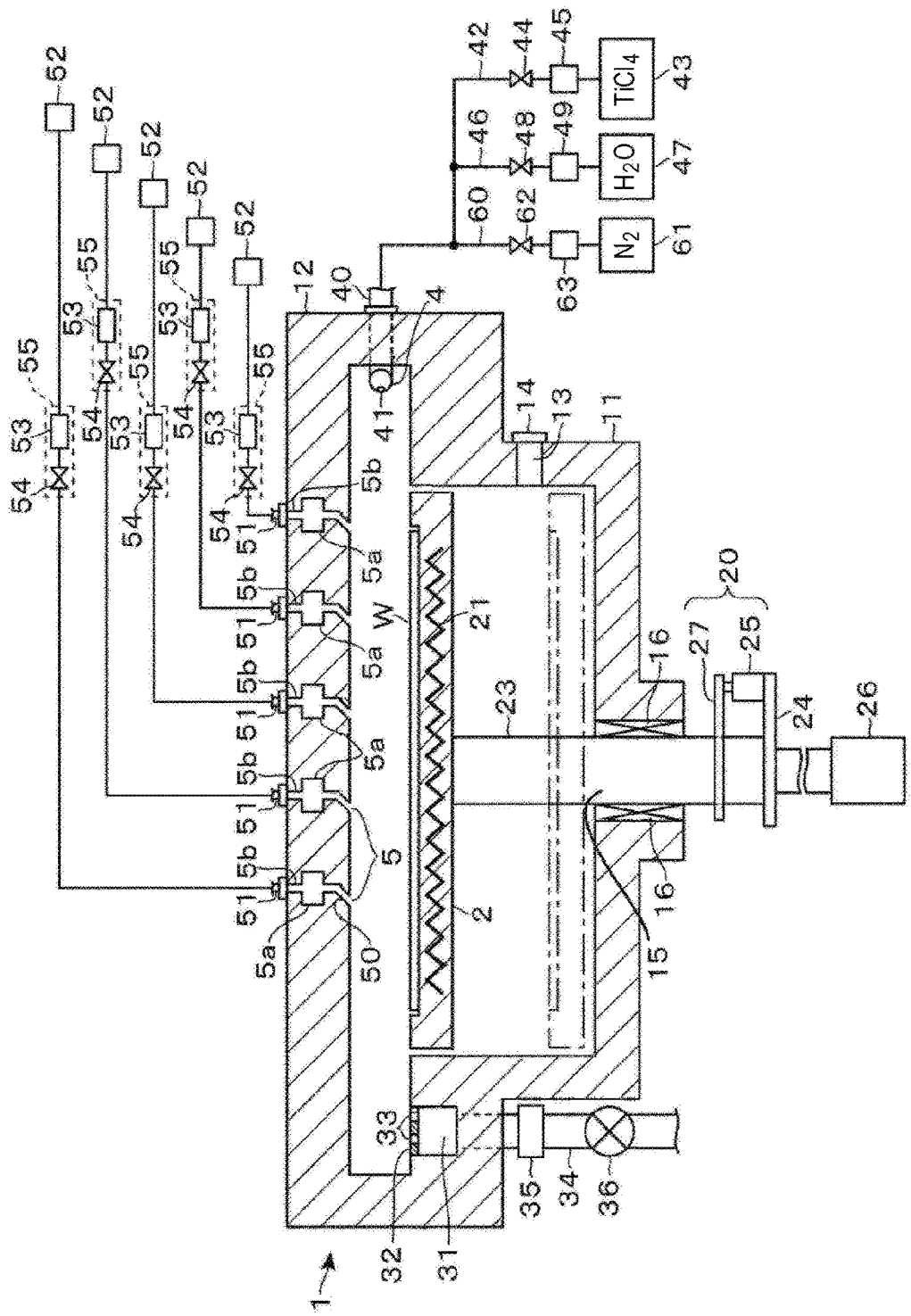
FIG. 1 is a vertical sectional side view of a film forming apparatus according to a first embodiment.

As a film forming apparatus according to a first embodiment, there will be described a film forming apparatus that implements a so-called atomic layer deposition (ALD) method which performs a film formation by alternately supplying a raw material gas and a reaction gas and laminating an atomic layer or a molecular layer. As illustrated in FIG. 1, the film forming apparatus includes a process container 1 as a vacuum container in which a film forming process is performed with respect to a wafer W as a substrate. The process container 1 includes a lower container portion 11 which is a cylindrical portion opened at its upper side and a square-tube-shaped upper container portion 12 which is continuously installed on the lower container portion 11 so as to surround an upper part of the lower container portion 11. The internal space of the lower container portion 11 and the internal space of the upper container portion 12 communicate with each other. The internal space of the upper container portion 12 constitutes a processing space in which a film forming process is performed. A loading/unloading gate 13 for loading and unloading the wafer W and a gate valve 14 for opening and closing the loading/unloading gate 13 are provided in a sidewall surface of the lower container portion 11.

A mounting table 2, which is a substrate mounting part for mounting the wafer W, is disposed within the process container 1. The mounting table 2 is formed in a disc shape by a metal such as, e.g., aluminum or the like. A heater 21 for heating the wafer W to a film forming temperature of, for example, 100 to 400 degrees C. is embedded within the mounting table 2. The clearance between the side surface of the mounting table 2 and the sidewall of the lower container portion 11 is set at such a small size as not to obstruct the elevating movement of the mounting table 2. The processing space and the lower space are partitioned by the mounting table 2.

An elevating plate 24 is connected to the central portion of the lower surface of the mounting table 2 via a shaft portion 23 extending in an up-down direction through an opening portion 15 formed on the bottom surface of the process container 1. A bearing portion 16 configured to allow the shaft portion 23 to make an elevating and rotating movement is installed between the opening portion 15 and the shaft portion 23 in order to air-tightly isolate the atmosphere of the process container 1 from the outside. A motor 25 is installed on the upper surface of the elevating plate 24. The motor 25 is connected to the shaft portion 23 via a belt 27. The shaft portion 23 and the mounting table 2 are rotated about a vertical axis by rotating the belt 27 with the motor 25. The motor 25 and the belt 27 constitute a rotation mechanism 20.

An elevator mechanism 26 is installed at the lower surface side of the elevating plate 24. The shaft portion 23 and the mounting table 2 are one-piece formed with the elevating plate 24 and are moved up and down by the elevator mechanism 26. When a film forming process is performed by supplying a film forming gas to the wafer W, the mounting table 2 is moved to a processing position indicated by a solid line in FIG. 1, in which, for example, the front surface of the wafer W is substantially flush with the upper surface of the inner bottom wall of the upper container portion 12. When the wafer W is delivered between the mounting table 2 and an external transfer mechanism, the mounting table 2 is moved down from the processing position to a lower position which is a loading/unloading position indicated by a chain line in FIG. 1.

Figure 2:
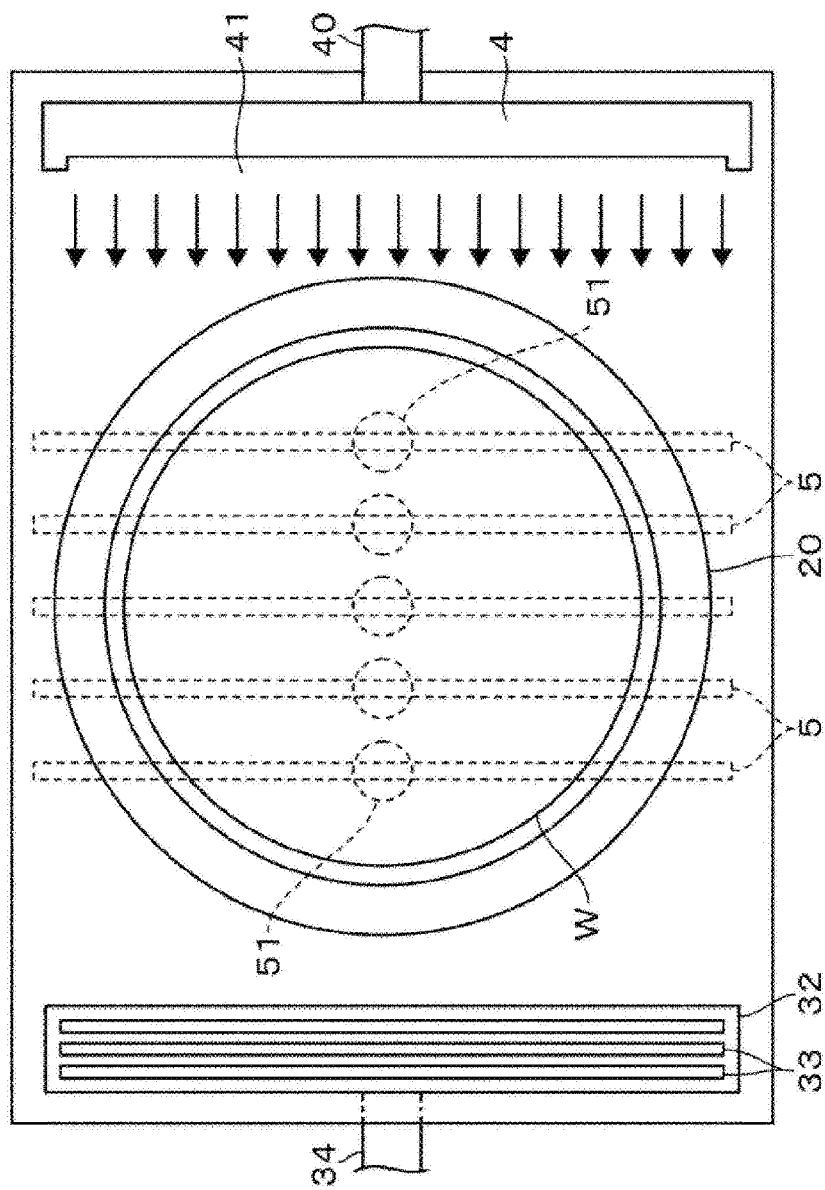
FIG. 2 is a plane view of the film forming apparatus according to the first embodiment.

Subsequently, the upper container portion 12 will be described with reference to FIG. 2. For example, if it is assumed that the left side and the right side viewed from the wafer W are a front side and a rear side, respectively, an exhaust groove 31 as an exhaust port having a rectangular cross section, which extends in the width direction, namely in the left-right direction at the front side of the wafer W, is formed at one longitudinal end within the upper container portion 12. The upper surface side of the exhaust groove 31 is opened on the bottom surface of the upper container portion 12. A lid portion 32 having a plurality of slits 33 respectively extending in the width direction of the upper container portion 12 and arranged side by side in the longitudinal direction of the upper container portion 12 is installed in the opening portion of the exhaust groove 31. An exhaust pipe 34 is connected to the center of the bottom portion of the exhaust groove 31. A pressure regulation part 35 and an exhaust valve 36 are installed in the exhaust pipe 34 sequentially from the side of the exhaust groove 31. The exhaust pipe 34 is connected to a vacuum exhaust pump not shown.

At the rear side of the interior of the upper container portion 12, a film forming gas injection part 4 formed of a tubular member and configured to constitute a gas supply part is installed so as to extend in the left-right direction. A slit 41 as a film forming gas injection hole extending in the longitudinal direction of the film forming gas injection part 4 is formed in the film forming gas injection part 4 so that the slit 41 is opened toward the front side. The slit 41 is formed at a length larger than the width of the wafer W so as to cover the entire surface of the wafer W in a plane view. The slit 41 is formed so that a film forming gas can pass through the entire surface of the wafer W.

A gas supply pipe 40 is connected to the longitudinal center of the film forming gas injection part 4 at the rear side thereof. A raw material gas supply pipe 42 for supplying a raw material gas, a reaction gas supply pipe 46 for supplying a reaction gas reacting with the raw material gas and a replacement gas supply pipe 60 for supplying a replacement gas are merged with the gas supply pipe 40. The other end of the raw material gas supply pipe 42 is connected to a supply source 43 of $TiCl_4$ which is a raw material gas. A flow rate adjustment part 45 and a valve 44 are installed in the raw material gas supply pipe 42 sequentially from the side of the $TiCl_4$ supply source 43. The other end of the reaction gas supply pipe 46 is connected to a supply source 47 of $H_2O$ which is a reaction gas. A flow rate adjustment part 49 and a valve 48 are installed in the reaction gas supply pipe 46 sequentially from the side of the $H_2O$ supply source 47. In this example, the term "film forming gas" is used to indicate the raw material gas and the reaction gas. A nitrogen ($N_2$) gas supply source 61 is connected to the other end of the replacement gas supply pipe 60. A flow rate adjustment part 62 and a valve 63 are installed in the replacement gas supply pipe 60 sequentially from the side of the $N_2$ supply source 61.

As illustrated in FIG. 1, in the ceiling portion of the process container 1 facing the mounting table 2, dilution gas supply ports 5 (each of which includes an opening portion and a portion of a supply path continuous with the opening portion) for supplying a concentration adjustment gas which adjusts the concentration of the film forming gas, for example a nitrogen gas as a dilution gas, are formed at a plurality of points, for example, at five points at regular intervals, along the flow direction of the film forming gas. As illustrated in FIG. 2, each of the dilution gas supply ports 5 is formed in the shape of a slit extending in the left-right direction (in the width direction of the flow of the film forming gas) and extending in the width direction so as to cover the entire surface of the wafer W in a plane view. In this example, the length dimension of the dilution gas supply ports 5 in the left-right direction (in the width direction of the flow of the film forming gas) is set at the same length dimension as the length dimension of the slit 41 of the film forming gas injection part 4 in the left-right direction (in the width direction of the flow of the film forming gas).

Figure 3:
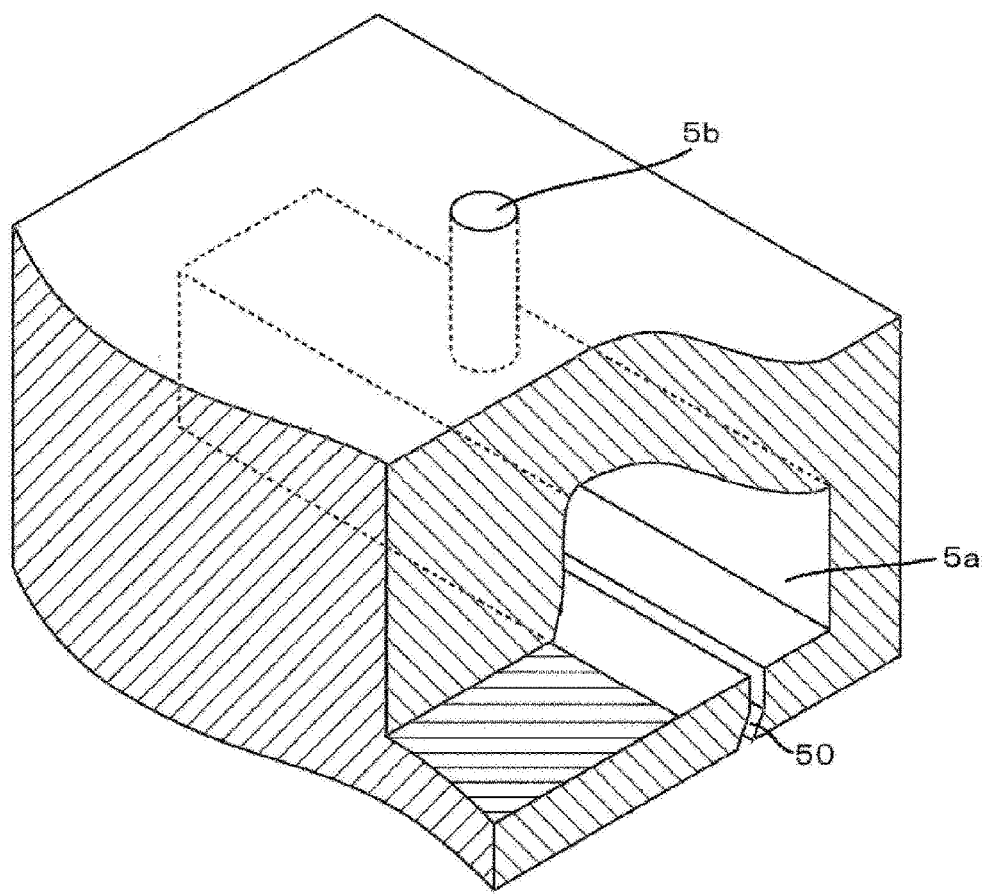
FIG. 3 is a perspective view illustrating an upper side configuration of a dilution gas supply path.

As illustrated in FIG. 1, each of the dilution gas supply ports 5 includes a dilution gas supply path 50 obliquely formed in the ceiling of the upper container portion 12 so that the dilution gas is obliquely injected toward the front side (toward the exhaust groove 31). The dilution gas supply path 50 is formed so as to extend in the left-right direction (in the width direction of the flow of the film forming gas) and is configured so that the dilution gas is supplied from each of the dilution gas supply ports 5 toward the upper surface of the wafer W mounted on the mounting table 2 at a uniform flow rate in the width direction (the left-right direction). As illustrated in FIGS. 1 and 3, a square-tube-shaped buffer chamber 5a extending in the width direction of the flow of the dilution gas (in the left-right direction) is formed at the upper side (upstream side) of the dilution gas supply path 50. A communication path 5b extending through the central portion of the ceiling surface of the buffer chamber 5a is formed at the upper side of the buffer chamber 5a. The upper end of the communication path 5b is opened toward the upper side of the process container 1. A dilution gas supply pipe 51 is connected to the upper end of the communication path 5b. A dilution gas supply source 52 is installed at the upstream end of the dilution gas supply pipe 51. A flow rate adjustment part 53 and a valve 54 are installed in the dilution gas supply pipe 51 sequentially from the upstream side. The low rate adjustment part 53 and the valve 54 correspond to a dilution gas adjustment part 55.

Subsequently, descriptions will be made on the action of the embodiment of the present disclosure. First, the wafer W as a substrate to be processed is mounted on the mounting table 2 by, for example, an external transfer arm not shown and is heated by the heater 21. Then, the gate valve 14 is closed and the process container 1 is sealed. Thereafter, for example, the supply of an $N_2$ gas from the film forming gas injection part 4 is started and the exhaust from the exhaust groove 31 is performed to regulate the internal pressure of the process container 1. Then, the mounting table 2 is moved up to the processing position.

Figure 4:
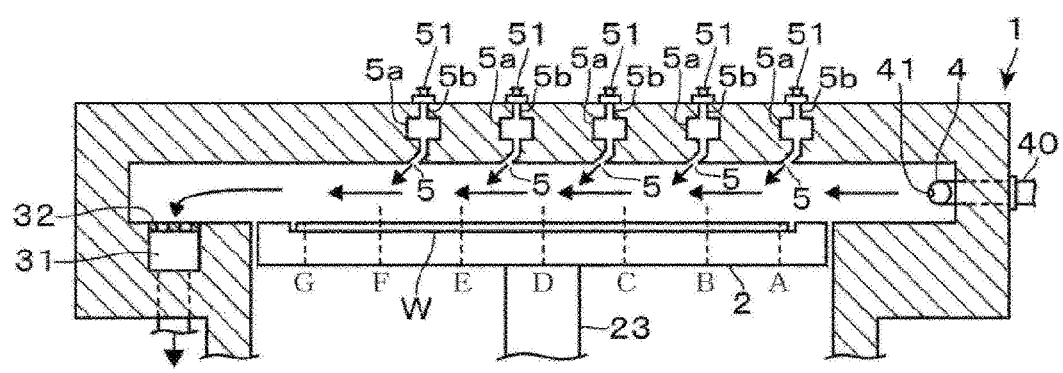
FIG. 4 is a schematic view illustrating an action of the film forming apparatus according to the first embodiment.

Thereafter, a film forming process is performed by an ALD method using $TiCl_4$, which is a raw material gas, and $H_2O$, which is a reaction gas, as film forming gases. Descriptions will be made on a method of supplying these film forming gases to the wafer W. As illustrated in FIG. 4, while performing the exhaust from the exhaust groove 31, the supply of the film forming gases toward the wafer W mounted on the mounting table 2 is started and the dilution gas is supplied from the respective dilution gas supply ports 5 toward the wafer W. When introduced from the gas supply pipe 40 into the film forming gas injection part 4, the film forming gases are uniformly diffused within the film forming gas injection part 4. Thereafter, the film forming gases are supplied from the slit 41 of the film forming gas injection part 4 at a uniform flow rate in the width direction of the wafer W (in the left-right direction). The film forming gases flow along the surface of the wafer W over the entire surface. Thereafter, the film forming gases are introduced into the exhaust groove 31 while maintaining a parallel flow and are exhausted from the exhaust pipe 34.

Figure 5:
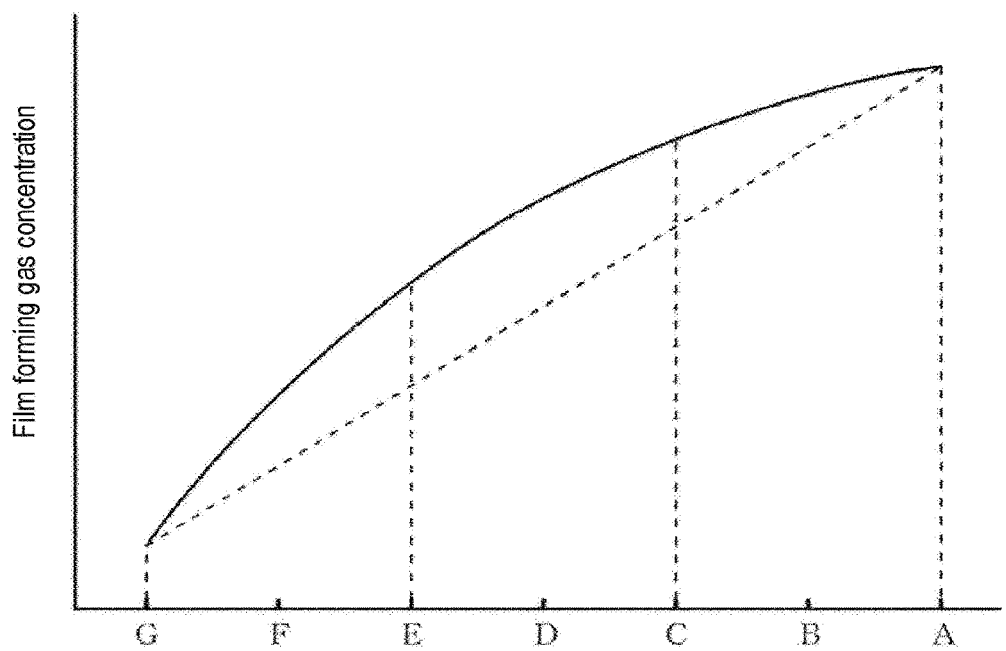
FIG. 5 is a schematic view illustrating a concentration distribution of a film forming gas.

FIG. 5 is a schematic view illustrating a film forming gas concentration. A to G in FIG. 5 correspond to points (positions) A to G in FIG. 4. At point A existing at the upstream side of a film forming gas flow in FIG. 5, which is a peripheral edge portion (rear end portion) of the wafer W, the film forming gas has substantially the same concentration as the concentration of the raw material gas and the reaction gas in the gas supplied from the film forming gas injection part 4. Since the film forming gas is consumed by performing a film forming process with respect to the wafer W, the concentration of the film forming gas in the vicinity of the surface of the wafer W is gradually reduced toward the front surface (toward the exhaust groove 31), namely toward the downstream side. Schematically saying, the concentration of the film forming gas is diluted at point B of the most upstream side where the film forming gas and the dilution gas flowing along the surface of the wafer W are merged with each other. The diluted film forming gas further flows toward the front side. The diluted film forming gas is further diluted at point C where the film forming gas is subsequently merged with the dilution gas. Then, the film forming gas flows toward the front side while being diluted in the order of points D, E and F.

Figure 6:
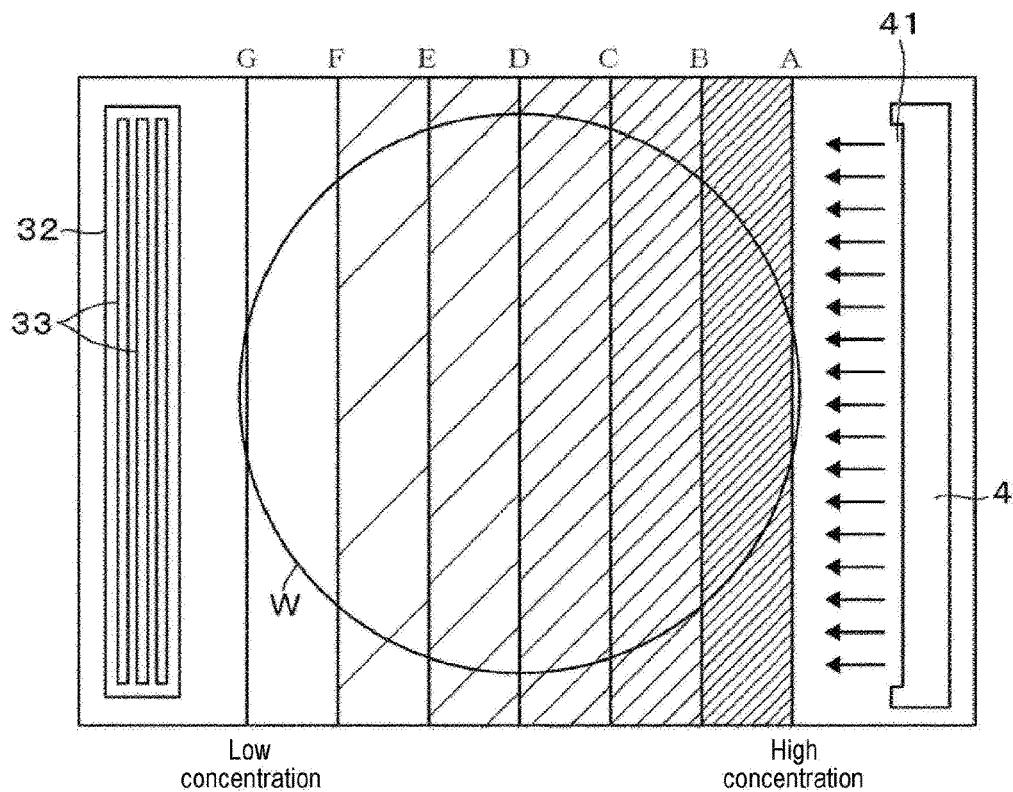
FIG. 6 is a schematic view illustrating the concentration distribution of the film forming gas in a plane.

Thus, for example, as indicated by a graph in FIG. 5, the concentration of the film forming gas (the concentration of the raw material gas or the reaction gas) grows thinner toward the downstream side. At this time, the film forming gas is supplied at a uniform flow rate in the width direction of the flow of the film forming gas and the dilution gas is supplied from the slit-shaped dilution gas supply ports 5 extending in the width direction of the flow of the film forming gas at a uniform flow rate in the width direction of the flow of the film forming gas. Since the concentration of the film forming gas is changed in the flow direction of the film forming gas, as illustrated by a schematic view in FIG. 6, the concentration of the film forming gas becomes uniform in the width direction of the flow of the film forming gas. FIG. 6 is a view schematically illustrating the concentration distribution in the flow direction of the film forming gas. In FIG. 6, the film forming gas having a higher concentration is distributed in a region in which the hatching density is higher.

Then, the wafer W is rotated about a vertical axis by driving the rotation mechanism 20. If the wafer W is rotated in the atmosphere in which the concentration of the film forming gas is uniform in the width direction and is continuously changed in one direction as illustrated in FIG. 6, the portion of the wafer W other than the center (rotation center) thereof is repeatedly moved between a region in which the concentration of the film forming gas is high and a region in which the concentration of the film forming gas is low. That is to say, when viewed from the respective portions of the wafer W, a state in which the concentration of the film forming gas in the atmosphere is gradually decreased and then gradually increased is repeated. When the wafer W is rotated once, the portion having the same distance from the center passes through the same region. Thus, the film thickness in the circumferential direction is uniform. The film thickness is determined depending on the concentration change pattern with respect to the time change when the portion of the wafer W is rotated once. Accordingly, the thin film formed on the surface of the wafer W has a concentric film thickness distribution which is determined depending on the concentration distribution in the flow direction of the film forming gas in the vicinity of the surface of the wafer W. As described above, the concentration distribution of the film forming gas is determined depending on the degree of dilution by the dilution gas supplied from the respective dilution gas supply ports 5. Thus, the concentration distribution of the film forming gas can be adjusted by changing the flow rate of the dilution gas supplied from the respective dilution gas supply ports 5 with the dilution gas adjustment part 55.

Descriptions will be made on a case where a concentration distribution, in which the concentration of the film forming gas is linearly reduced with respect to the distance from the slit 41, for example, as indicated by a dotted line in the graph of FIG. 5, is formed by adjusting the dilution gas supplied from the respective dilution gas supply ports 5. In the case of such a concentration distribution, the deposition rate when the wafer W passes through the more upstream side of the flow of the film forming gas than the center of the wafer W is higher than the deposition rate in the central portion of the wafer W. The deposition rate when the wafer W passes through the more downstream side of the flow of the film forming gas than the center of the wafer W is lower than the deposition rate in the central portion of the wafer W. Since the slope of the graph is a straight line, the rising amount of the deposition rate at the upstream side is equal to the falling amount of the deposition rate at the downstream side. Accordingly, as can be rioted from the examples which will be described later, the film thickness obtained when the central region of the wafer W is rotated once becomes substantially equal to the film thickness obtained when the peripheral region of the wafer W is rotated once. Thus, the film is formed so that the film thickness on the surface of the wafer W becomes uniform.

If the supply amount of the dilution gas supplied from the dilution gas supply ports 5 is gradually increased from the upstream side toward the downstream s indicated by a solid line in the graph of FIG. 5, the reduction in the concentration of the film forming gas becomes smaller at the upstream side and becomes larger at the downstream side. In this concentration distribution of the film forming gas, for example, the increase in the concentration in the central region of the wafer W between points C and E in FIG. 5 is larger than the increase in the concentration indicated by a dotted line in FIG. 5. Thus, a film having a thickness increased in proportion to the rising amount of the concentration is formed. In contrast, the rising amount of the concentration with respect to the concentrations between points A and C and between points E and F indicated by a dotted line in FIG. 5 is smaller than the rising amount of the concentration with respect to the concentration between points C and E indicated by a dotted line in FIG. 5. A film is formed on the peripheral portion the wafer W while the peripheral portion of the wafer W is moved over the range between points A and G. The deposition rate when the peripheral portion of the wafer W passes through the ranges between points A and C and points E and F is lower than the deposition rate in the range between points C and E in FIG. 5. Thus, a film is more difficult to be formed in the peripheral position of the wafer W than in the central position thereof. Consequently, a concentric film thickness distribution having a large film thickness in the central portion and a small film thickness in the peripheral portion is formed on the wafer W.

Figure 7:
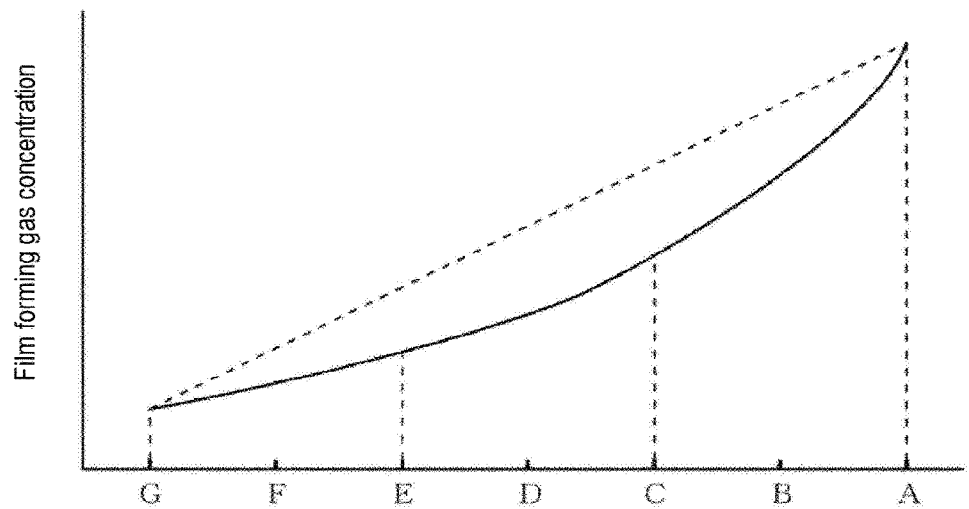
FIG. 7 is a schematic view illustrating the concentration distribution of the film forming gas.

Furthermore, by increasing the gas injection amount of the upstream-side dilution gas supply ports 5, for example, the dilution gas supply ports 5 which supply the dilution gas toward points B and C in FIG. 4, and by reducing the gas injection amount of the downstream-side dilution gas supply ports 5, for example, the dilution gas supply ports 5 which supply the dilution gas toward points E and F in FIG. 4, it is possible to form a concentration distribution in which, as indicated in the graph of FIG. 7, the reduction in the concentration of the film forming gas is large at the upstream side and the reduction in the concentration of the film forming gas is small at the downstream side. According to this concentration distribution of the film forming gas, for example, in the central region of the wafer W between points C and E in FIG. 7, the concentration is lower than the concentration indicated by a dotted line in FIG. 7 and the film is made thin just as much as the falling amount of the concentration. In contrast, in the peripheral region, the falling amount of the concentration with respect to the concentrations between points A and C and between points E and F indicated by a dotted line in FIG. 7 is smaller than the falling amount of the concentration with respect to the concentration between points C and E indicated by a dotted line in FIG. 7. Accordingly, the deposition rate when the peripheral portion of the wafer W passes through the ranges between points A and C and points E and F is higher than the deposition rate in the range between points C and E in FIG. 7. Thus, a film is more easily formed in the peripheral position of the wafer W than in the central position thereof. Consequently, a concentric film thickness distribution having a small film thickness in the central portion and a large film thickness in the peripheral portion is formed on the wafer W. Accordingly, by adjusting the flow rate of the dilution gas with the dilution gas adjustment part 55, it is possible to adjust the concentration distribution of the film forming gas and to adjust the thickness of the film formed on the wafer W. Thus, the dilution gas adjustment part 55 corresponds to a film thickness adjustment portion.

In this way, the film forming gas is supplied to the surface of wafer W at a uniform flow rate in the width direction and the concentration of the film forming gas is continuously changed in the flow direction of the film forming gas. On the surface of the wafer W, the flow of the film forming gas is easily disturbed particularly at the downstream side. For that reason, the film forming gas is more easily mixed in the width direction than in the flow direction of the film forming gas. Thus, even if one tries to generate a difference in the concentration of the film forming gas in the width direction of the flow of the film forming gas, it is difficult to maintain the concentration difference. In contrast, a flow moving toward one side is formed in the flow direction of the film forming gas. Thus, the film forming gas is difficult to be mixed in the flow direction of the film forming gas. Accordingly, by continuously changing the concentration of the film forming gas in the flow direction of the film forming gas, it is possible to stably form an atmosphere in which the difference in the concentration of the film forming gas is maintained in one direction.

The film forming process will be described again. In the film forming process using the ALD method, a $TiCl_4$ gas as a raw material gas is first supplied for, e.g., 1 second. The valve 44 is closed. $TiCl_4$ is allowed to be adsorbed onto the surface of the wafer W. Subsequently, a replacement gas ($N_2$ gas) is supplied into the process container 1 to replace the internal atmosphere of the process container 1. Then, if a reaction gas ($H_2O$) gas is supplied into the process container 1, a molecular film of $TiO_2$ is formed on the surface of the wafer W by the hydrolysis and dechlorination reaction. Thereafter, the replacement gas is supplied into the process container 1 to replace the internal atmosphere of the process container 1. By repeating, multiple times, a cycle of supplying the raw material gas containing $TiCl_4$, the replacement gas, the reaction gas and the replacement gas into the process container 1 in this way, molecular layers of $TiCl_4$ are laminated to form a $TiO_2$ film having a predetermined thickness.

According to the embodiment described above, in the film forming apparatus which forms a film by supplying the film forming gas to the surface of the wafer W, the film forming gas is supplied as a unidirectional flow to the surface of the wafer W at a uniform flow rate in the width direction. The dilution gas is supplied from the dilution gas supply ports 5 arranged side by side in the flow direction of the film forming gas, thereby continuously changing the concentration of the film forming gas in the flow direction of the film forming gas. Under this atmosphere, a film is formed on the surface of the wafer W while rotating the wafer W. Accordingly, the thickness distribution of the thin film formed on the wafer W is formed in a concentric shape. By adjusting the amount of the dilution gas supplied from the dilution gas supply ports 5 and adjusting the concentration distribution in the flow direction of the film forming gas, it is possible to adjust the concentric film thickness distribution. Furthermore, the concentration of the film forming gas in the flow direction of the film forming gas is continuously changed. Therefore, the concentration distribution of the film forming gas is less susceptible to the influence of flow turbulence and is stabilized. It is therefore possible to stably obtain an expected film thickness distribution in the thin film thus formed. By obtaining a film thickness distribution corresponding to the in-plane tendency of an etching apparatus, it is possible to improve the in-plane uniformity after an etching process.

Furthermore, the concentration-distribution-adjusting gas supplied to the flow of the film forming gas on the surface of the wafer W is not limited to the dilution gas such as an inert gas or he like. As an alternative example, a gas obtained by diluting a precursor-containing raw material gas with an inert gas may be supplied so as to adjust the concentration of the film forming gas. Moreover, the concentration of the film forming gas may be adjusted by supplying the film forming gas rather than the dilution gas from the dilution gas supply ports 5 illustrated in FIG. 1. In the case where the difference between the maximum flow rate and the minimum flow rate of the film forming gas injected from the film forming gas injection part 4 in the width direction of the flow of the film forming gas falls within a range of ±10%, for example, ±100 ml/min when the average flow rate of the film forming gas is assumed to be 1,000 ml/min, it is possible to sufficiently achieve the above effects. Thus, it can be considered that the flow rate of the film forming gas is made uniform in the width direction of the flow of the film forming gas.

[Second Embodiment]

Figure 8:
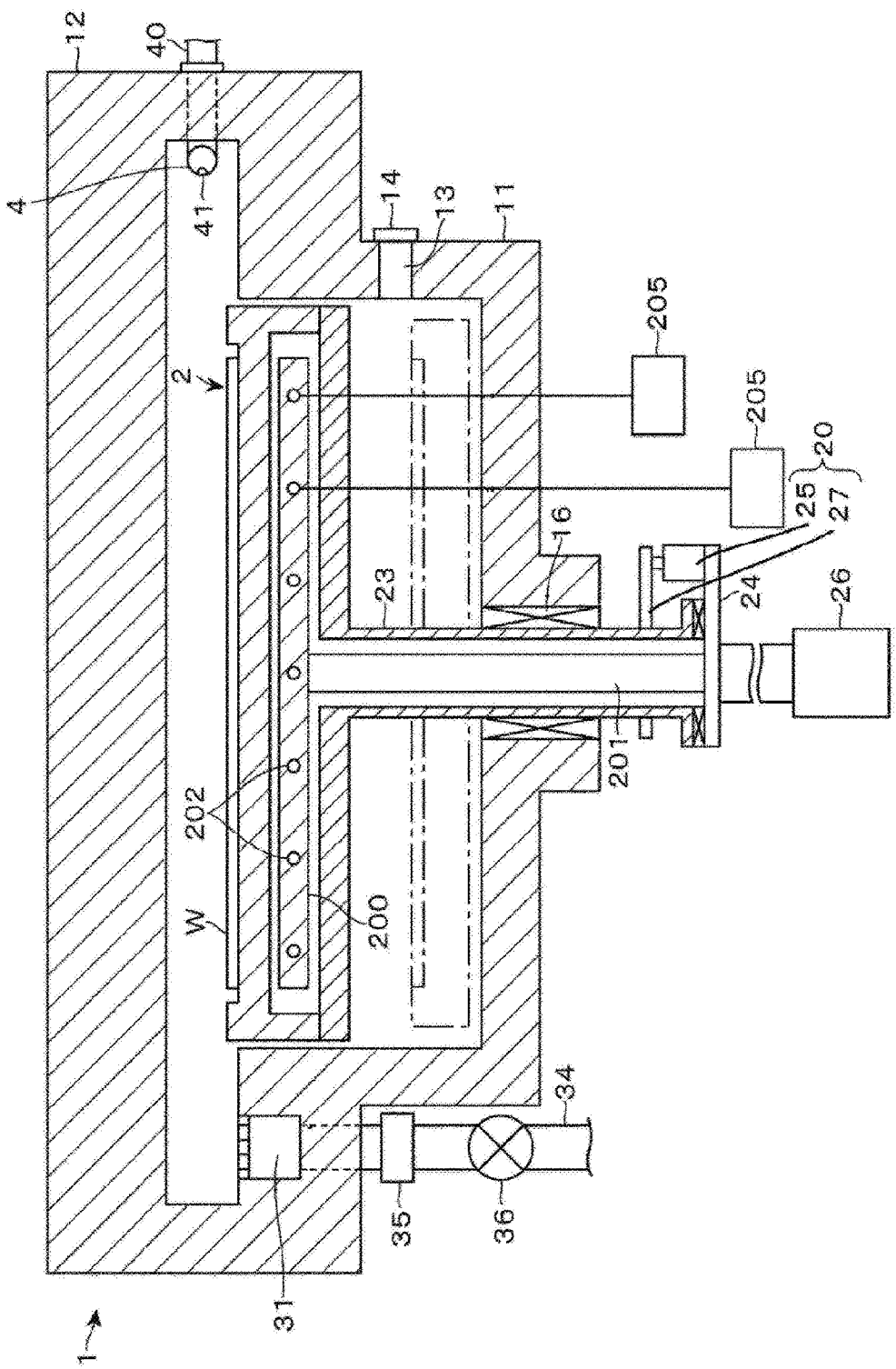
FIG. 8 is a vertical sectional side view of a film forming apparatus according to a second embodiment.
Figure 9:
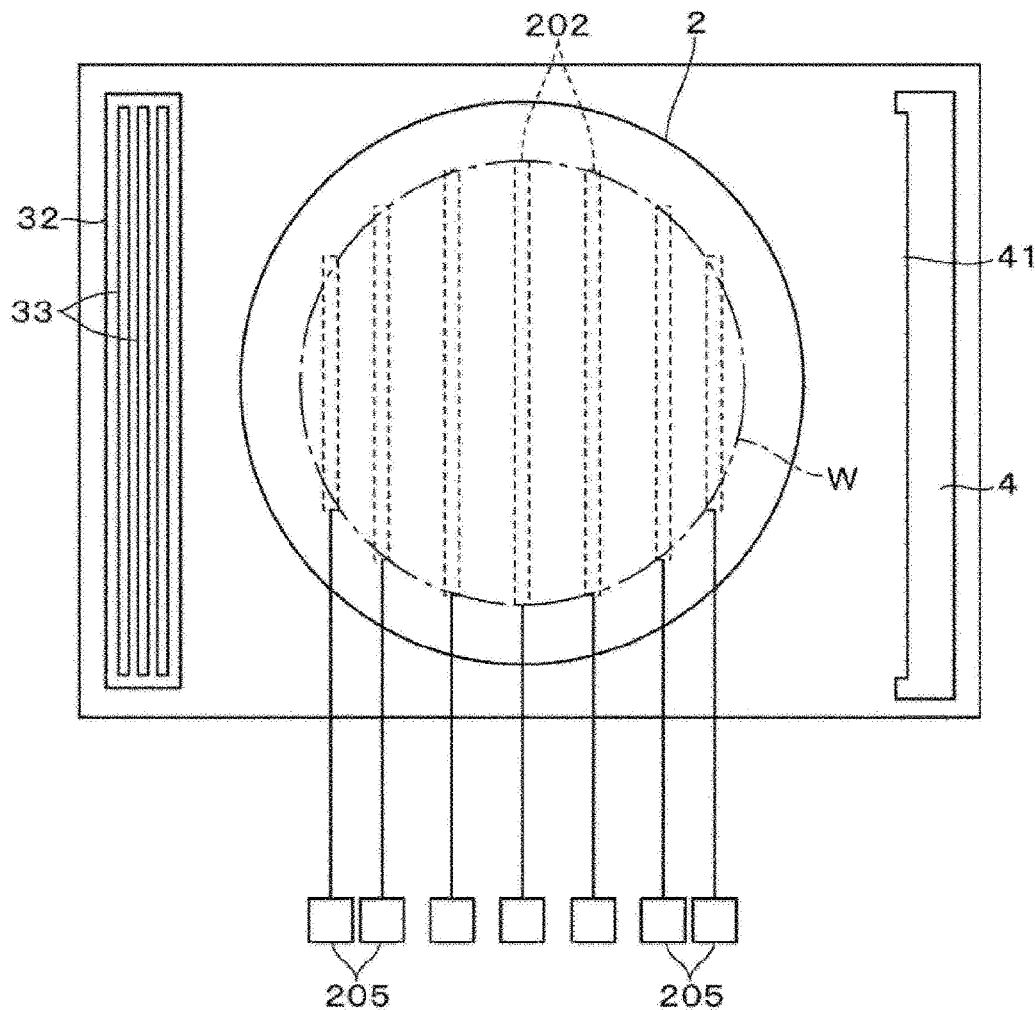
FIG. 9 is a plane view of the film forming apparatus according to the second embodiment.

The method of adjusting the film thickness distribution in the flow direction of the film forming gas with the wafer W kept stationary is not limited to the method of adjusting the concentration distribution of the film forming gas in the flow direction. For example, it may be possible to use a film forming method in which the deposition rate in the flow direction of the film forming gas is changed by changing the distribution of the heating temperature of the wafer W. The second embodiment is directed to this method. For example, a film forming apparatus illustrated in FIG. 8 is used in this method. The configuration of this film forming apparatus will now be described. A disc-shaped heating plate 200 is installed within the internal space of the mounting table 2 in a spaced-apart relationship with the inner surface of the mounting table 2. Furthermore, a central shaft 201 is installed within the shaft portion 23 in a spaced-apart relationship with the inner surface of the shaft portion 23. The heating plate 200 is fixed the elevating plate 24 through the central shaft 201. As illustrated in FIG. 9, rod-shaped heaters 202 constituting a temperature adjustment part and extending in the direction orthogonal to the flow direction of the film forming gas, namely in the width direction, are embedded within the heating plate 200 and are arranged side by side in the flow direction of the film forming gas. The respective heaters 202 are configured so that the temperatures thereof can be independently adjusted by power supply parts 205. In FIG. 8, some of the power supply parts 205 are omitted.

Descriptions will be made on the action of the film forming apparatus according to the second embodiment. The wafer W is mounted on the mounting table 2. Thereafter, heating is started in a state in which, for example, the temperature of the heater 202 disposed at the most upstream side with respect to the flow of the film forming gas is set at a highest temperature and the temperatures of the heaters 202 disposed at the downstream side are set at gradually decreasing temperatures by the power supply parts 205 connected to the respective heaters 202. If the film forming gas is supplied to the surface of the wafer W in this state, a film is formed such that the film thickness is large at the upstream side with respect to the flow of the film forming gas and is gradually reduced toward the downstream side. This is because the temperature available at the upstream side is a temperature suitable for the film formation. Even when the wafer W is rotated, the heating plate 200 provided with the heaters 202 is not rotated because the heating plate 200 is installed in a spaced-apart relationship with the mounting table 2 and is fixed to the central shaft 201. At this time, the wafer W is rotated while being heated by the heaters 202. The rotational speed of the wafer W is lowered so that a temperature gradient in which the temperature decreases from the upstream side of the flow of the film forming gas toward the downstream side is maintained on the surface of the wafer W. Briefly speaking, the wafer W is rotated while maintaining a state in which the deposition rate is high at the upstream side of the flow of the film forming gas and is gradually reduced toward the downstream side. Thus, a film having a concentric film thickness distribution is formed on the wafer W. Accordingly, the thickness of the film as formed can be adjusted depending on the temperatures of the respective heaters 202 set by the respective power supply parts 205.

Furthermore, the wafer W may be intermittently rotated when a film is formed by rotating the wafer W in a state in which the temperature of the heater 202 disposed at the most upstream side with respect to the flow of the film forming gas is set at a highest temperature and the temperatures of the heaters 202 disposed at the downstream side are set at gradually decreasing temperatures. For example, a film forming process may be performed by alternately repeating a step of stopping the wafer W for 0.5 second and a step of rotating the wafer W by 50 degrees about a vertical axis. With this configuration, it is possible to form a film by rotating the wafer W in a state in which a temperature gradient where the temperature becomes lower from the upstream side of the flow of the film forming gas toward the downstream side is formed on the surface of the wafer W. It is therefore possible to achieve the same effects as described above.

Since the film forming gas is consumed as it flows along the surface of the wafer W, the concentration of the film forming gas becomes lower toward the downstream side. For that reason, if the temperature distribution is formed in the direction differing from the flow direction of the film forming gas, for example, in the direction orthogonal to the flow direction of the film forming gas, a difference in the thickness of the film as formed is generated even in the region where the temperature remains the same. Thus, the method of forming the temperature distribution of the wafer W in the flow direction of the film forming gas as in the second embodiment is effective.

[Third Embodiment]

Figure 10:
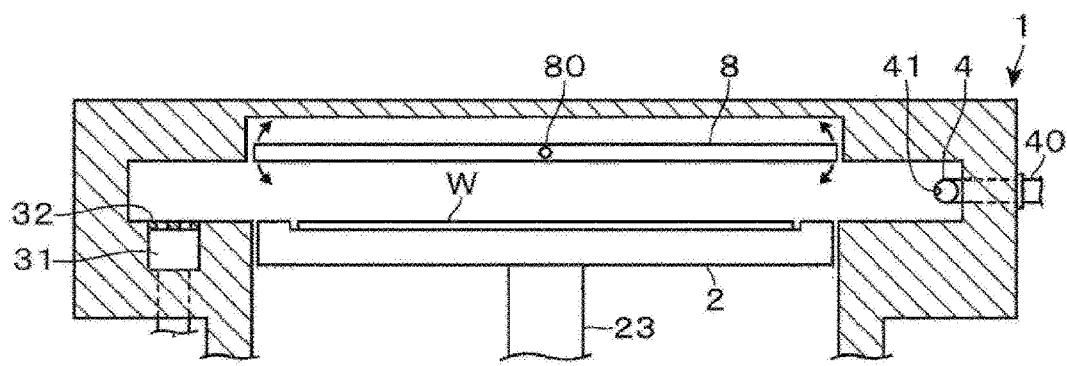
FIG. 10 is a vertical sectional side view of a film forming apparatus according to a third embodiment.

Next, descriptions will be made on a film forming apparatus according to a third embodiment. As illustrated in FIG. 10, in this film forming apparatus, a top plate part 8 which constitutes a facing surface part is installed above the mounting table 2. The top plate part 8 is configured so that the inclination of the top plate part 8 can be changed by rotating the top plate part 8 about a central shaft 80 extending in the left-right direction (the width direction of the flow of the film forming gas) at the upper side of the central portion of the wafer W. The flow velocity of the film forming gas flowing along the surface of the wafer W becomes lower if the height dimension between the surface of the wafer W and the top plate part 8 grows larger. The flow velocity becomes higher if the height dimension grows smaller. The deposition rate becomes low in the region where the flow velocity of the film forming gas is high. The deposition rate becomes high in the region where the flow velocity of the film forming gas is low. In the case where the turbulence of a gas flow is concerned, the top plate part 8 may be installed so as to extend to above the film forming gas injection part 4. By rotating the wafer W in this state, it is possible to adjust the concentric film thickness distribution formed on the wafer W.

[Fourth Embodiment]

Figure 11:
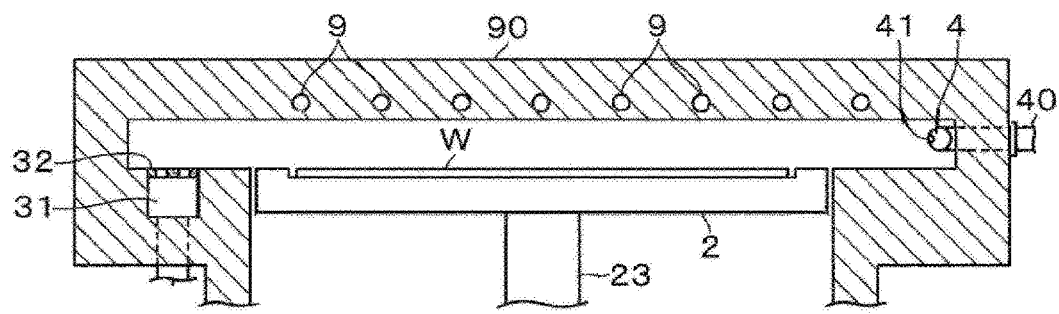
FIG. 11 is a vertical sectional side view of a film forming apparatus according to a fourth embodiment.

Descriptions will be made on a film forming apparatus according to a fourth embodiment. As illustrated in FIG. 11, rod-shaped heaters 9 extending over the wafer W in the width direction with respect to the flow direction of the film forming gas are embedded in a top plate part 90 as a facing surface part facing the mounting table 2 so that the rod-shaped heaters 9 are arranged side by side in the flow direction of the film forming gas. For example, the temperatures of the heaters 9 disposed at the downstream side are set at higher temperatures and the temperatures of the heaters 9 disposed at the upstream side are set at lower temperatures.

Thus, if the raw material gas is supplied while heating the raw material gas with the respective heaters 9, the raw material gas is adsorbed onto the top plate part 90 by the heat of the heaters 9. Since the temperatures of the heaters 9 disposed at the downstream side are set at higher temperatures, the adsorption amount of the raw material gas adsorbed onto the top plate part 90 becomes larger at the downstream side. As a result, the deposition rate on the top plate part 90 grows higher. For that reason, according to the distribution of the adsorption amount of the raw material gas adsorbed onto the top plate part 90 in the flow direction of the raw material gas, the adsorption amount of the raw material gas adsorbed onto the surface of the wafer W becomes smaller and the deposition rate becomes lower. Accordingly, by rotating the wafer W, it is possible to form a film having a concentric film thickness distribution on the wafer W. It is possible to adjust the concentration gradient of the film forming gas from the upstream side toward the downstream side on the surface of the wafer W. This makes it possible to adjust the concentric film thickness distribution formed on the wafer W.

Figure 12:
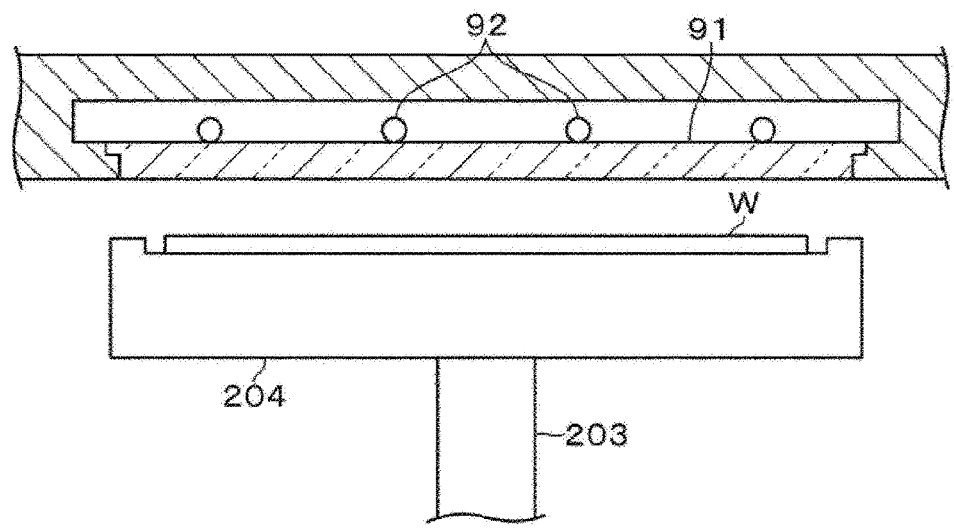
FIG. 12 is a vertical sectional side view illustrating another example of an embodiment of the present disclosure.
Figure 13:
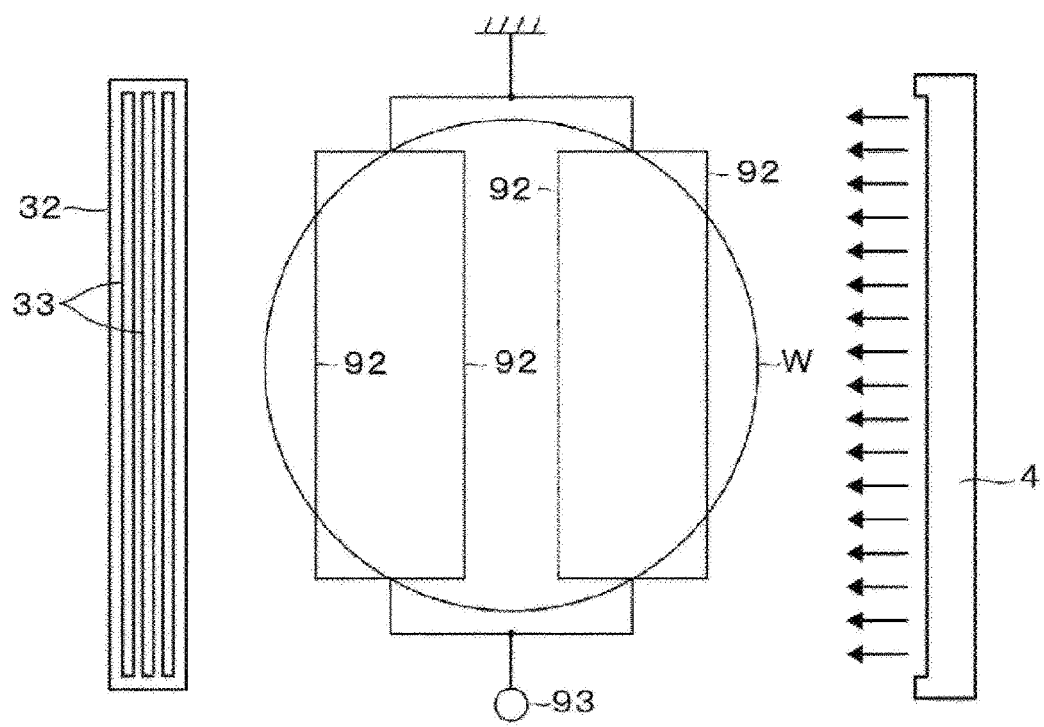
FIG. 13 is a plane view illustrating a high-frequency antenna according to another example of an embodiment of the present disclosure.

The present disclosure may be applied to a chemical vapor deposition (CVD) apparatus in which a raw material gas is decomposed or allowed to react with a reaction gas in a gas phase. Furthermore, the present disclosure may be applied to a film forming apparatus in which a film forming process is performed through the use of plasma. For example, as illustrated in FIG. 12, in the film forming apparatus illustrated in FIG. 8, a dielectric window 91 formed of, for example, a quartz plate, may be installed above the wafer W in a facing relationship with the mounting table 2 so as to air-tightly divide the air atmosphere existing above the dielectric window 91 and the internal vacuum atmosphere of the process container 1. For example, four linear high-frequency antennas 92 are placed on the dielectric window 91 so as to extend in the direction orthogonal to the flow direction of the film forming gas (in the width direction). As illustrated in FIG. 13, for example, two ends of the high-frequency antennas 92 disposed at the upstream side in the flow direction of the film forming gas are connected to each other. Similarly, two ends of the high-frequency antennas 92 disposed at the downstream side in the flow direction of the film forming gas are connected to each other. The bunch of the two high-frequency antennas 92 disposed at the upstream side and the bunch of the two high-frequency antennas 92 disposed at the downstream side are connected to each other at the longitudinal opposite ends thereof. A terminal 93 is installed at one longitudinal end side of the bunch of four high-frequency antennas 92 and is connected to a high-frequency power source. The other longitudinal end of the bunch of four high-frequency antennas 92 is grounded. In this film forming apparatus which makes use of plasma, for example, a raw material gas ($TiCl_4$ gas) is intermittently supplied while continuously supplying oxygen to the process container 1. When the supply of the raw material gas is stopped, a high-frequency current is supplied to the high-frequency antennas 92, thereby forming an induction electromagnetic field at the upper side of the wafer W and converting oxygen to plasma. In this way, a film forming process is performed.

EXAMPLES

The following tests were conducted in order to verify the effects achieved in the embodiment of the present disclosure.

Example 1

In the case where a film forming gas is horizontally supplied toward a 300 mm wafer W and where a film thickness distribution of a film formed when a film forming process is performed with the wafer W kept stopped is set so that a film thickness is linearly reduced from the upstream side of the flow of the film forming gas toward the downstream side, a film thickness distribution on the surface of the wafer W when a film is formed by rotating the wafer W was found by simulation.

Example 2

The same processing as that of example 1 was performed except that the thickness distribution of a film formed when a film forming process is performed with the wafer W kept stopped is set so that the film thickness is gently reduced at the upstream side of the flow of the film forming gas and is sharply reduced at the downstream side.

Example 3

The same processing as that of example 1 was performed except that the thickness distribution of a film formed when a film forming process is performed with the wafer W kept stopped is set so that the film thickness is sharply reduced at the upstream side of the flow of the film forming gas and is gently reduced at the downstream side.

Figure 14:
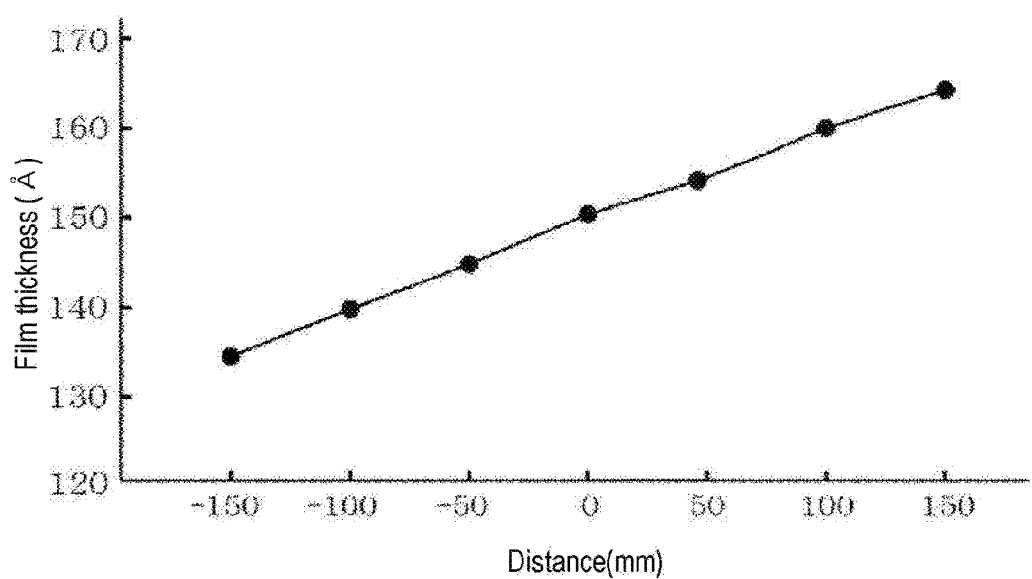
FIG. 14 is an explanatory view illustrating a set value of a film thickness distribution in example 1.
Figure 15:
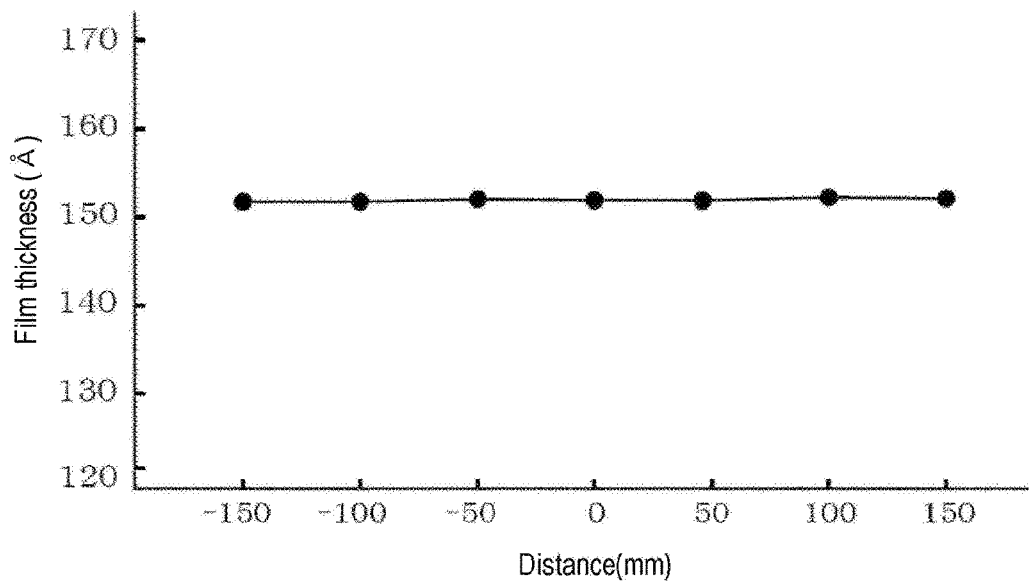
FIG. 15 is a characteristic diagram illustrating a film thickness distribution in example 1.
Figure 16:
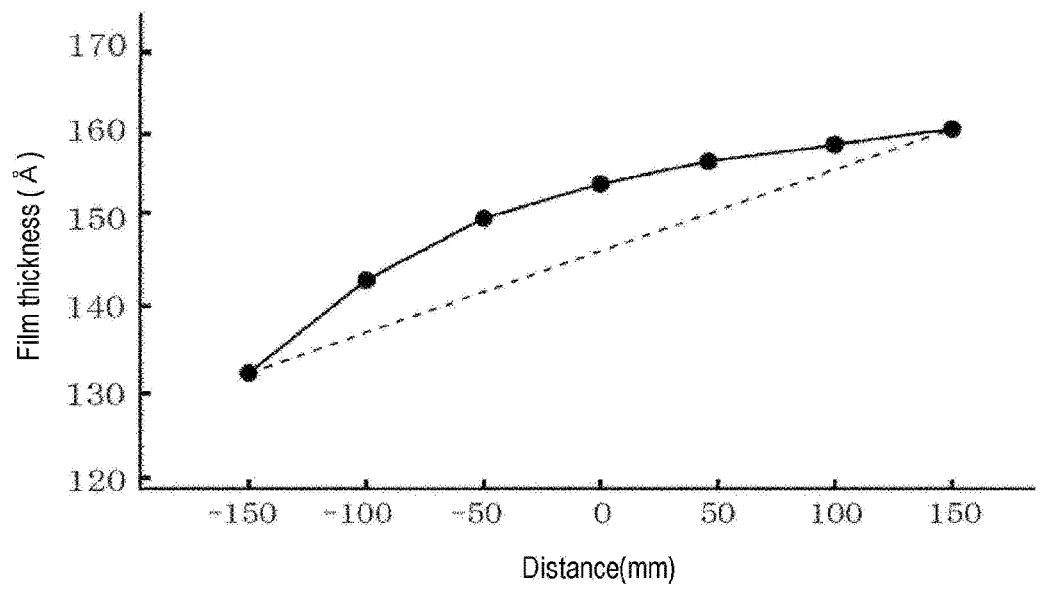
FIG. 16 is an explanatory view illustrating a set value of a film thickness distribution in example 2.
Figure 17:
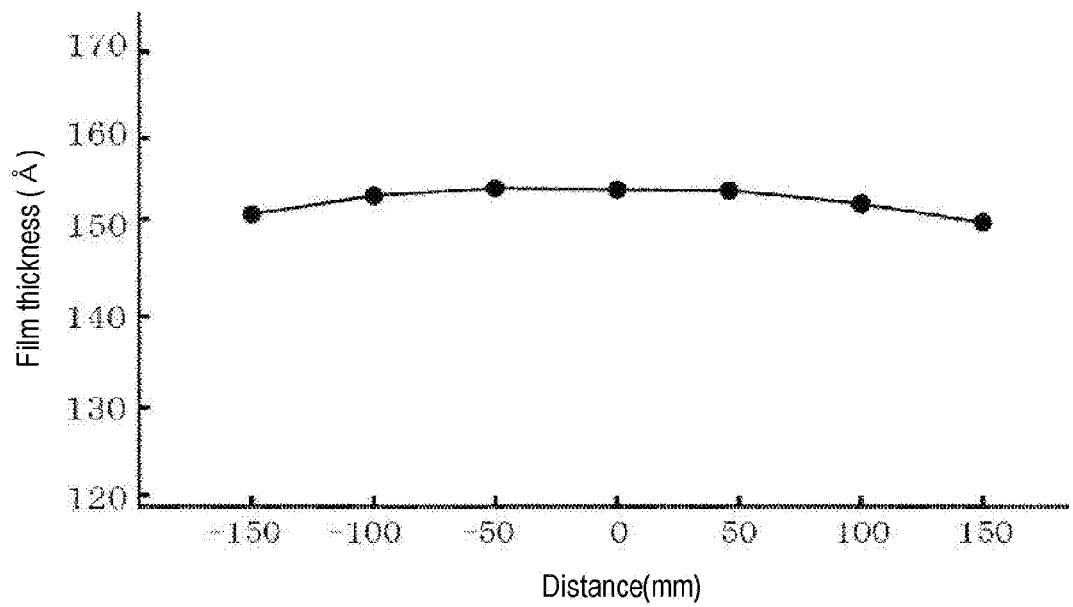
FIG. 17 is a characteristic diagram illustrating a film thickness distribution in example 2.
Figure 18:
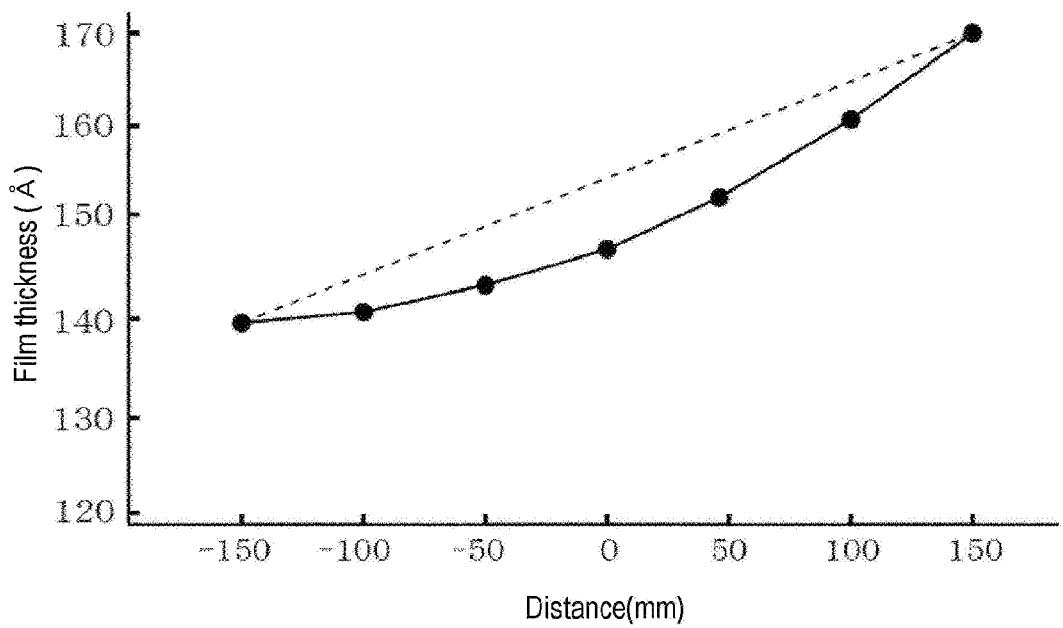
FIG. 18 is an explanatory view illustrating a set value of a film thickness distribution in example 3.
Figure 19:
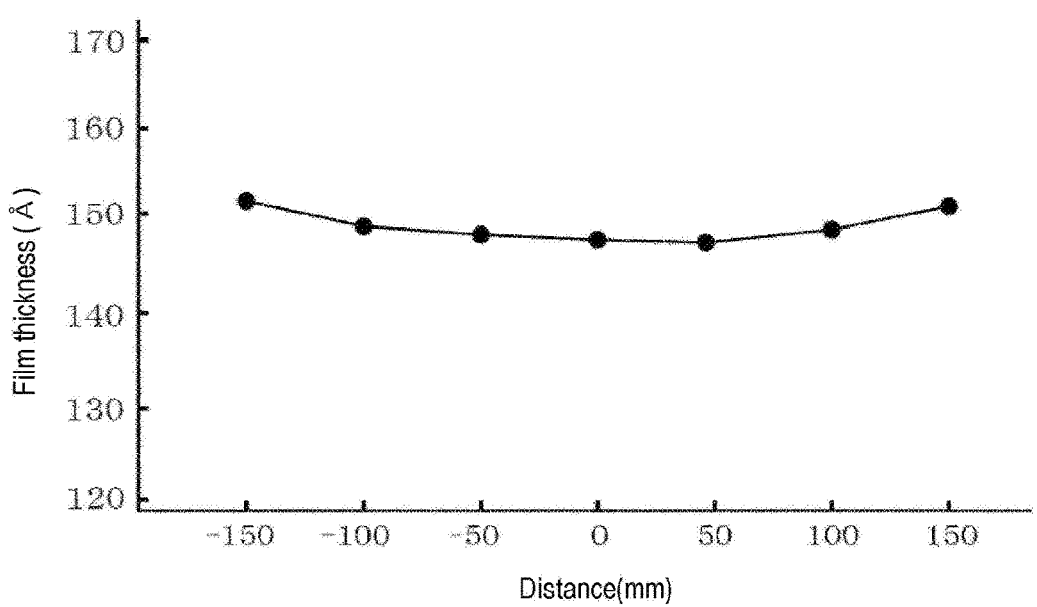
FIG. 19 is a characteristic diagram illustrating a film thickness distribution in example 3.

FIG. 14 illustrates a film thickness distribution in example 1 when a film forming process is performed with the wafer W kept stopped. FIG. 15 is a characteristic diagram of a film formed in example 1, in which the horizontal axis indicates the radial distance from the center of the wafer W and the vertical axis indicates the film thickness. FIG. 16 illustrates a film thickness distribution in example 2 when a film forming process is performed without rotating the wafer W. FIG. 17 is a characteristic diagram of a film formed in example 2, in which the horizontal axis indicates the radial distance from the center of the wafer W and the vertical axis indicates the film thickness. FIG. 18 illustrates a film thickness distribution in example 3 when a film forming process is performed without rotating the wafer W. FIG. 19 is a characteristic diagram of a film formed in example 3, in which the horizontal axis indicates the radial distance from the center of the wafer W and the vertical axis indicates the film thickness.

According to these results, as illustrated in FIGS. 14 and 15, in the case where the film thickness of the film formed by performing the film forming process with the wafer W kept stopped is linearly reduced from the upstream side of the flow of the film forming gas toward the downstream side, the film is formed by rotating the wafer W. By doing so, it is possible to obtain a film having high in-plane film thickness uniformity. In example 1, the value of σ1 was 0.1%.

As illustrated in FIGS. 16 and 17, it can be noted that a convex film having a large thickness in the central portion of the wafer W and a small thickness in the peripheral portion of the wafer W is formed in example 2. As illustrated in FIGS. 18 and 19, it can be noted that a concave film having a small thickness in the central portion of the wafer W and a large thickness in the peripheral portion of the wafer W is formed in example 3.

According to these results, in the present disclosure, it can be said that the concentric film thickness distribution formed when the film is formed by rotating the wafer W can be adjusted by adjusting the film thickness distribution of the film, which is formed when the film forming process is performed without rotating the wafer W, so as to be changed in the flow direction of the film forming gas.

According to the present disclosure, when a film is formed by supplying a film forming gas to a substrate, the film forming gas is supplied as a unidirectional flow moving in a transverse direction along the substrate, while rotating the substrate. A film thickness distribution of a thin film formed on the substrate is adjusted in a flow direction of the film forming gas. Accordingly, it is possible to adjust a concentric film thickness distribution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A film forming apparatus, comprising:
a process container configured to generate a vacuum atmosphere;
a mounting part provided within the process container, and configured to mount a substrate;
a heating part configured to heat an opposite side from a mounting surface of the mounting part to heat the substrate mounted on the mounting part;
a gas supply part installed at a rear side of the substrate mounted on the mounting part, and configured to supply a film forming gas so that the film forming gas flows toward a front side of the substrate along a surface of the substrate over the entire surface of the substrate and so that a flow rate of the film forming gas becomes uniform in a width direction of a flow of the film forming gas;
a rotation mechanism configured to rotate the mounting part about an axis orthogonal to the substrate when the film forming gas is supplied to the substrate;
a film thickness adjustment part configured to adjust a film thickness distribution of a film on the substrate in a flow direction of the film forming gas when viewed in a state in which the mounting part is stopped; and
an exhaust port provided at the front side of the substrate,
wherein the film thickness adjustment part is a concentration adjustment gas supply part provided to face the substrate and configured to supply a concentration adjustment gas to the flow of the film forming gas in order to adjust a concentration distribution of the film forming gas in the flow direction of the film forming gas, wherein the concentration adjustment gas supply part is further configured to extend in a width direction of the flow of the film forming gas, the concentration adjustment gas supply part including a plurality of gas injection ports arranged in the flow direction of the film forming gas to inject a dilution gas as the concentration adjustment gas, wherein each of the plurality of gas injection ports includes a supply path obliquely formed toward the front side of the substrate and having a slit shape extending in the width direction by a length more than a size of the substrate, and a tube-shaped buffer chamber communicating with the supply path and extending in the width direction, to assist the dilution gas to be injected at a uniform rate in the width direction, and wherein the plurality of gas injection ports is configured to inject the dilution gas at the uniform rate in the width direction and to be able to inject the dilution gas at different rates in the flow direction.

* * * * *